US010338110B2

(12) United States Patent
Limon-Garcia-Viesca et al.

(10) Patent No.: US 10,338,110 B2
(45) Date of Patent: Jul. 2, 2019

(54) DIGITALLY COMPENSATING FOR THE IMPACT OF INPUT BIAS CURRENT ON CURRENT MEASUREMENTS

(71) Applicant: NATIONAL INSTRUMENTS CORPORATION, Austin, TX (US)

(72) Inventors: Pablo E. Limon-Garcia-Viesca, Cedar Park, TX (US); Christopher G. Regier, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 409 days.

(21) Appl. No.: 15/359,462

(22) Filed: Nov. 22, 2016

(65) Prior Publication Data

US 2017/0146575 A1 May 25, 2017

Related U.S. Application Data

(60) Provisional application No. 62/258,794, filed on Nov. 23, 2015.

(51) Int. Cl.
*G01R 19/32* (2006.01)
*G01R 15/14* (2006.01)
*G01R 19/00* (2006.01)

(52) U.S. Cl.
CPC ........... *G01R 19/32* (2013.01); *G01R 15/146* (2013.01); *G01R 19/0092* (2013.01)

(58) Field of Classification Search
CPC .................. G01R 19/0092; G01R 15/146
USPC .. 324/500, 750.3, 757.04, 762.03, 600, 663, 324/671, 200, 207.13, 207.22, 239, 241, 324/515, 520, 530, 105
See application file for complete search history.

(56) References Cited

U.S. PATENT DOCUMENTS

| 4,453,092 | A | 6/1984 | Joseph |
| 4,492,972 | A | 1/1985 | Gorecki |
| 5,128,564 | A | 7/1992 | Harvey |
| 6,501,327 | B1 | 12/2002 | Tam |
| 7,564,309 | B2 | 7/2009 | Chiu |
| 8,970,301 | B2 | 3/2015 | Johnson |

(Continued)

*Primary Examiner* — Melissa J Koval
*Assistant Examiner* — Trung Nguyen
(74) *Attorney, Agent, or Firm* — Meyertons Hood Kivlin Kowert and Goetzel PC; Jeffrey C. Hood

(57) ABSTRACT

A source-measure unit (SMU) may be implemented with digital control loops and circuitry to digitally compensate for the impact of input bias current on current measurements. One or more buffers having well-defined characteristics with respect to certain parameters which may affect the current measurements may be used in the output signal path of the SMU where a shunt voltage developed across a current sense element is measured. For example, the buffers may conduct/develop respective input bias currents that change perceptibly and predictably with temperature. By measuring the temperature and adjusting a control voltage—which is used to develop the shunt voltage—according to the temperature measurements, the impact of the input bias current [s] on the current measurement[s] may be reduced to negligible levels and/or may be eliminated. The control voltage may be adjusted by adjusting a voltage feedback value representative of the measured shunt voltage, and/or by adjusting a current setpoint used for generating the control voltage.

20 Claims, 4 Drawing Sheets

(56) References Cited

U.S. PATENT DOCUMENTS

| | | | |
|---|---|---|---|
| 9,246,484 B2 | 1/2016 | Kusuda | |
| 9,735,736 B2 | 8/2017 | Kusuda | |
| 2006/0025892 A1* | 2/2006 | Leung | H02M 3/33515 700/293 |
| 2009/0121908 A1* | 5/2009 | Regier | G01R 31/2841 341/142 |
| 2015/0256169 A1 | 9/2015 | Kusuda | |

* cited by examiner

DIGITALLY COMPENSATING FOR THE IMPACT OF INPUT BIAS CURRENT ON CURRENT MEASUREMENTS

PRIORITY CLAIM

This application claims benefit of priority of U.S. Provisional Patent Application Ser. No. 62/258,794 titled "Digitally Compensating for the Impact of Input Bias Current on Current Measurements", filed on Nov. 23, 2015, which is hereby incorporated by reference as though fully and completely set forth herein.

BACKGROUND OF THE INVENTION

Field of the Invention

This invention relates generally to measurement systems and, more particularly, to digitally compensating for the impact of input bias current on current measurements.

Description of the Related Art

Measurement systems are used to perform a variety of functions, including measurement of physical phenomena, a unit under test (UUT), or device under test (DUT), test and analysis of physical phenomena, process monitoring and control, control of mechanical or electrical machinery, data logging, laboratory research, and analytical chemistry, to name a few examples.

A typical contemporary measurement system includes a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPM (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications. DAQ devices may also include a Source-Measure Unit (SMU), which may apply a voltage and/or current to a DUT and measure the resulting current and/or voltage. SMUs are typically configured to operate according to what is commonly referred to as "compliance limits", to limit the output current when sourcing voltage, and limit the output voltage when sourcing current. In other words, a compliance limit on the measured signal may determine the (maximum) value of the sourced signal. For example, when applying a source voltage to a DUT and measuring current, a given current value (e.g. 1 A) specified as the compliance limit would determine the (maximum) input (source) voltage that might be provided to the DUT. In most cases compliance limits may depend and/or may be determined based on the DUTs, e.g. the maximum (absolute) value of the current that may flow into the DUT, or the maximum (absolute) value of the voltage that may be applied across the terminals of the DUT.

In the case of most SMUs, the setpoint (the desired output voltage when sourcing and regulating voltage, or the desired current value when sourcing and regulating current) and the compliance limits are typically programmable. SMUs are available to cover a variety of signal levels, from the microvolt (μV) range to the kilovolt (kV) range, and from the femtoampere (fA) range to the ampere (A) range. Some SMUs can deliver or dissipate significant power, while other SMUs may be operated at low power. The accuracy of SMUs is typically less than the accuracy of high-quality calibrators and/or digital multi meters (DMMs).

For quite a while, SMUs were implemented with precision digital-to-analog converters (DACs) used for programming the setpoint and compliance limits into analog control loops. The output voltage across the output terminals of the SMU, or the output current flowing into the output terminal of the SMU were typically set using the analog control loops by comparing the outputs to the levels set by the DACs. Each output voltage or output current could be controlled separately, with only one of the analog control loops closed at any given time. Voltage values representative of current and voltage measurements were provided to an analog-to-digital converter (ADC) element. In some SMUs, separate ADCs (instead of a single ADC) were used to read the analog output voltage or the analog output current. These SMUs were generally limited in flexibility and were high in complexity, resulting from requirements to minimize glitches during range switching. In order for the SMU to operate accurately, a high level of accuracy was required for the DACs and ADCs configured in the SMU.

A more recent trend has been to implement SMUs with a control loop configured in the digital domain. The output voltage and output current in such a configuration are measured with dedicated ADCs. When sourcing current, the current readings obtained by the ADCs are compared to a Current Setpoint, and when sourcing voltage, the voltage readings are compared to a Voltage Setpoint, to regulate the current and voltage outputs, respectively. The setpoints can be set, for example, in an FPGA (field programmable gate array) or DSP (digital signal processing) chip. The FPGA or DSP chip can be used accordingly to produce an output to drive a DAC until the output voltage and/or output current reach the respective desired levels. The SMU can be configured to source one type of signal while measuring another type of signal. For example, the SMU can be configured to measure the voltage across the terminals of a device under test (DUT), when sourcing (and regulating) a current to the DUT, and similarly, the SMU can be configured to measure the current flowing into the DUT, when sourcing (and regulating) the voltage applied across the terminals of the DUT.

When making low current measurements, the input bias current of the Op-Amps (Operational Amplifiers) oftentimes used as buffers for the signal can become a significant source of error. Minimizing/compensating for the error due to the input bias current is highly desirable for obtaining accurate measurements. However, present compensation methods require careful component selection which makes them susceptible to changes in process or end-of life issues associated with the selected component[s].

Other corresponding issues related to the prior art will become apparent to one skilled in the art after comparing such prior art with the present invention as described herein.

SUMMARY OF THE INVENTION

In some embodiments, a source-measure unit (SMU) may be implemented with digital control loops and circuitry to digitally compensate for the impact of input bias current on current measurements. One or more buffers and/or Op-Amps having well-defined characteristics with respect to certain environmental or other type of parameters, e.g. JFET (Junction Field Effect Transistor) Op-Amps or buffers, may be used in the output signal path of the SMU where a high impedance node is located. For best measurement performance, the buffer components or buffer(s) may be selected such that when an input bias current (in the buffers) is present, the input bias current is a low and stable input bias current, for example due to the well-defined characteristic of the buffer(s). The JFET Op-Amps and/or buffers may develop respective input bias currents that change perceptibly and predictably with temperature. By measuring the temperature and applying a correction algorithm, the impact of the input bias current on the accuracy of the current measurements may be greatly reduced, that is, the impact of the input bias currents may be reduced below a level considered negligible in affecting the accuracy of the measurements. Alternately, the impact of the input bias currents on the accuracy of the measurements may be eliminated altogether.

Responsive to the correction algorithm, the current measurement, e.g. a digital value representative of the current measurement may be corrected. The current measurement may be obtained by measuring or sensing a shunt voltage developed across a shunt element (or current sense element) as a result of a current conducted by the shunt element according to at least a control voltage. An obtained (digital) shunt voltage value representative of the (measured/sensed) shunt voltage therefore corresponds to (or is representative of) a value of the measured current. Consequently, this (numeric or digital) shunt voltage value may be corrected/ adjusted according to the correction algorithm. In some embodiments, the correction algorithm may apply the correction by adjusting the control voltage applied to the shunt element, based on the temperature measurements, if/when the measured shunt voltage value isn't adjusted directly.

Pursuant to the above, a measurement system/board may be used to measure voltage and current. The measurement system/board may include one or more buffers that conduct respective bias currents that have an effect on the current measurement, for example when a low-value range (e.g. in the μA-mA range in some embodiments) is selected for the measurement. The current may be measured by measuring a voltage across a resistor (shunt). At the same time, the temperature around the buffer(s) may also be measured. The temperature and the current offset caused by the buffer bias current(s) may then be used as inputs to a signal processing unit (or digital loop controller) which may include a model characterizing the buffers with respect to input bias current versus temperature. Based on the temperature measurements, and adjustment factor may be determined based on the model, and the adjustment factor may be applied to the measured value of the current (e.g. the measured shunt voltage which is representative/corresponds to the measured value of the current) to obtain an accurate current measurement value, e.g. a measurement value having an error considered negligible with respect to the selected measurement range.

Accordingly, in some embodiments, a method for digitally compensating for the impact of input bias current on current measurements may include developing a shunt voltage across a current sense element (or shunt element) according to a control voltage, digitally controlling the control voltage at least according to a current setpoint, obtaining a shunt voltage value representative of the shunt voltage, including measuring the shunt voltage at least via a signal path that includes one or more buffers conducting respective one or more input bias currents that change with respect to temperature, obtaining a temperature value representative of an operating temperature of the one or more buffers during the current measurements, and adjusting for the change of the respective one or more input bias currents based on the temperature value. The adjustment for the change of the respective one or more input bias currents may include adjusting the obtained shunt voltage value directly, at least according to the temperature value. Because the obtained shunt voltage value is representative of (corresponds to) the current to be measured, an adjustment of the obtained shunt voltage value represents and adjustment made to the measured current value. In some embodiments, the control voltage may be adjusted by adjusting the current setpoint at least according to the temperature value, or adjusting the control voltage at least according to the temperature value and the measured shunt voltage value. The temperature value may be obtained by obtaining measurements of the operating temperature of the one or more buffers during the current measurements. The temperature measurements may also be filtered to reduce noise.

In at least some embodiments, a control circuit may be used to digitally compensate for the impact of one or more parameters on current measurements. The control circuit may provide a control voltage to a current sense element, causing a shunt voltage to develop across the current sense element at least according to the control voltage. The control circuit may obtain a shunt voltage value representative of the shunt voltage by measuring the shunt voltage via a signal path that includes at least one or more components having a well-defined operational characteristic with respect to at least one parameter of the one or more parameters. The obtained shunt voltage value is representative of (or corresponds to) the measured current value. E.g., the measured current value may be obtained from the shunt voltage value and the value of the current sense element. The control circuit may also obtain a parameter value representative of an actual state of the at least one parameter at the one or more components during the current measurements, and may adjust the measured (obtained) shunt voltage value (or, correspondingly, the measured current value) at least according to the obtained parameter value, to adjust for a change of state of the one or components that occurs during the measurements according to the well-defined operational characteristic. In some embodiments, if/when not adjusting the current measurement value (e.g. the obtained/measured shunt voltage value) directly, the control circuit may adjust the control voltage at least according to the obtained parameter value and the shunt voltage value to adjust for the change of state of the one or components.

The control circuit may digitally control the control voltage at least according to a current setpoint, and may adjust the control voltage by adjusting the current setpoint at least according to the obtained parameter value. Furthermore, the control circuit may obtain the parameter value based on measurements of the actual state of the at least one parameter at the one or more components during the current measurements. The measurements of the actual state of the at least one parameter may be filtered prior to determining/obtaining the parameter value to reduce noise. The control circuit may also adjust the obtained parameter value to match associated properties of at least a circuit board on which the one or more components are configured.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
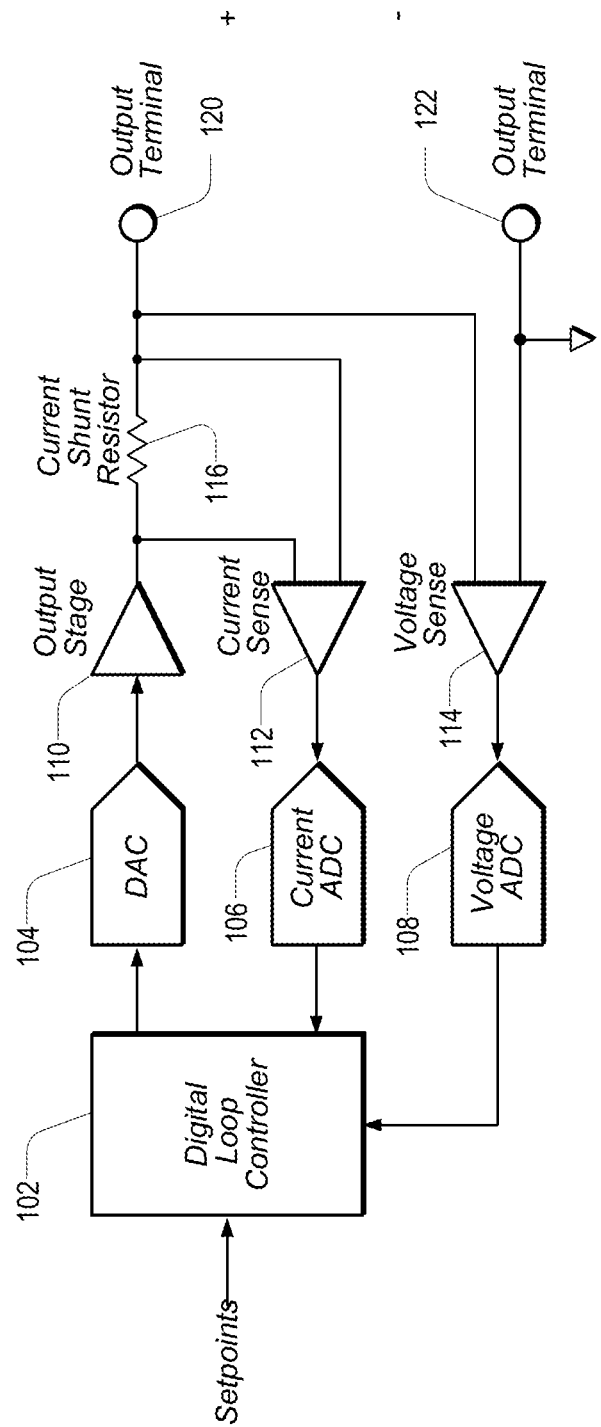
FIG. 1 shows the basic architecture of an exemplary prior art SMU (Source Measure Unit) featuring a digital control loop.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

FIG. 1 shows the basic architecture of one embodiment of a prior art SMU (source-measure unit) in which the entire control loop has been configured in the digital domain. A DUT (device under test), not shown, may be coupled between output terminals 120 and 122. Setpoints and compliance limits may be provided (programmed) to Digital Loop Controller (DCL) 102, which may provide a control output through DAC (digital-to-analog converter) 104 to Output Stage 110. Feedback from Output Stage 110 may be provided to Current ADC (analog-to-digital converter) 106 and Voltage ADC 108 via respective Current Sense element 112 and Voltage Sense element 114. The current feedback may be taken from the current flowing through current shunt resistor 116, and the feedback voltage may be taken from across output terminals 120 and 122. Current ADC 106 and Voltage ADC 108 may then provide the readback current and voltage values into DCL 102.

DCL 102 may be configured to check the measured current (from Current ADC 106) resulting from a sourced voltage, against the specified current compliance limit provided (or programmed) into DCL 102. DCL 102 may similarly be configured to check the measured voltage (from Voltage ADC 108) resulting from a sourced current, against the specified voltage compliance limit provided (or programmed) into DCL 102. To regulate the output, DCL 102 may be configured to check the measured current (from Current ADC 106) resulting from a sourced current, against the specified current setpoint provided (or programmed) into DCL 102. DCL 102 may similarly be configured to check the measured voltage (from Voltage ADC 108) resulting from a sourced voltage, against the specified voltage setpoint provided (or programmed) into DCL 102.

The compliance limits may effectively limit the magnitude of the sourced signals. DCL 102 may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit corresponding to a given DUT is 5V, when sourcing a 1 A current in the DUT results in a voltage measurement that exceeds 5V, DCL 102 may operate to lower the value of the sourced current below 1 A, until a sourced current value is reached for which the measured voltage no longer exceeds the allowed 5V. Similarly, if the setpoint for sourcing and regulating voltage is 5V, and the current compliance limit corresponding to a given DUT is 1 A, when sourcing a 5V voltage across the terminals of the DUT results in a current measurement that exceeds 1 A, DCL 102 may operate to lower the value of the sourced voltage below 5V, until a sourced voltage value is reached for which the measured current no longer exceeds the allowed 1 A.

The Digital Loop Controller (e.g. DCL 102) may provide the added flexibility of being able to operate the SMU for different compliance limits, (and being able to program multiple setpoints), without additional components. In addition, the loop bandwidth may easily be adjusted by changing the controller coefficients, and control loop adjustments may be made through measurable and controllable settling times of the signal. The DCL may also be reconfigurable to the desired mode, controlling/generating current, voltage, power, resistance, or voltage with series impedance, which may be valuable in battery simulation applications.

In one set of embodiments, DCL 102 may be implemented with an ASIC, a DSP, an FPGA, or any other suitable digital circuitry configured to perform the designated functions of DCL 102. An FPGA may be preferable for implementations utilizing National Instruments' LabVIEW graphical programming interface to write and simulate the control code. When using an FPGA with LabVIEW, the control code may be deployed and tested through LV-FPGA (LabVIEW FPGA). The control system itself may be designed to emulate a traditional SMU, while allowing users to implement more advanced features by writing their own control algorithm (for example in LV-FPGA when using LabVIEW and an FPGA). Some embodiments may also implement more advanced features such as constant power delivery or sinking, or constant resistance generation. For safety considerations, especially in user-configured situations, the output of DAC 304 may be limited to a safe level, regardless of feedback.

It should also be noted that when trying to regulate power, for example, two ADCs may be required for obtaining the requisite measurements for the power regulation to be performed. One ADC may be required to measure current (e.g. ADC 106) and another ADC may be required to measure voltage (e.g. ADC 108), with the multiplication (to obtain the power value that may be compared to a setpoint) performed digitally, in DCL 102, for example. Thus, certain embodiments, where the sourced and measured entity is the same (e.g. sourcing current and measuring current), may be configured with a single ADC. In one set of embodiments, when only always one entity (e.g. Current or Voltage) is to be measured, one of the ADCs may simply be removed. In another set of embodiments, the output from the Current Sense element and the output of the Voltage Sense element may be input to a multiplexer (not shown in any of the figures), which may be used to select whether sensed voltage or sensed current is to be converted to the digital value provided to the Digital Loop Controller. These embodiments may be useful, for example, in certain applications where compliance limits were unnecessary, and/or the primary functionality was regulation of the output.

Current Measurements

When making low current measurements, the input bias current of the Op-Amps that are oftentimes used as buffers for the measured signal can become a significant source of error. This bias current often varies with temperature. Choosing the correct Op-Amp or functionally equivalent circuit component is therefore extremely important. Oftentimes, choosing the most appropriate circuit component or Op-Amp to minimize error due to input bias current means sacrificing other parameters. For example, one of the most appropriate types of Op-Amp[s] used for low current measurements are Op-Amps designed with and manufactured using CMOS (Complementary Metal Oxide Semiconductor) technology. For such Op-Amps, the Op-Amp's input bias current is typically associated with the ESD (Electrostatic Discharge) diodes as there is almost no bias current flowing into or out of the gates of the input transistors. The input bias current from the ESD diodes is further reduced by some Op-Amp manufacturers by means of bootstrapping or careful manufacturing of such structures. However, the low input bias current associated with CMOS technology and CMOS devices is not entirely without disadvantages when considering the right Op-Amp for a given circuit. Usually, the voltage noise figures associated with CMOS Op-Amps far exceed the noise that may be characteristic of other Op-Amp technologies.

Another technology used in the design and manufacture of Op-Amps is JFET (Junction Field Effect Transistor) technology. JFET Op-Amps may feature exceptional voltage noise characteristics and favorable AC and DC characteristics as well. Op-Amps that use a JFET input transistor can have a very low input bias current at room temperature. JFET transistors include a semiconductor with a PN junction, with the property of approximately doubling reverse leakage current every 10° C. The leakage current in the junction is what causes the input bias current in JFET Op-Amps. At certain temperatures, for example close to room temperature such as 25° C., the input bias current may be small, but at higher temperatures the input bias current may become significant with respect to low current measurements. Similarly, small variations between the respective input bias currents of individual Op-Amps that are considered identical Op-Amp models might result in considerably larger variations at high temperatures. For at least this reason, low-current applications (in the pico-Ampere [pA] range or below) do not use JFET Op-Amps except possibly in case of very specialized low-temperature applications. Other types of Op-Amps are usually not considered for low-current applications due to their larger input bias currents.

Compensation Using Diodes and/or Opposite Type JFETs

Compensation of input bias current and input bias current temperature drift of JFET Op-Amps has been typically performed using a complementary JFET type or a diode coupled into the circuit in the reverse direction. In such cases the diode or the JFET is reverse biased in such a way that the characteristic of the bias current AND bias current vs. temperature curve are approximately identical but opposite to the characteristic of the input bias current properties of the Op-Amp. That is, the diode or JFET is reverse biased to effectively cancel, or the very least minimize, the impact of the input bias current. The problem with this method is that a careful selection of the JFET or diode—used in compensating for the impact of the input bias current of the Op-Amp—is required. The need for such careful component selection makes this approach susceptible to changes in process or end of life issues associated with the selected component[s].

Figure 3:
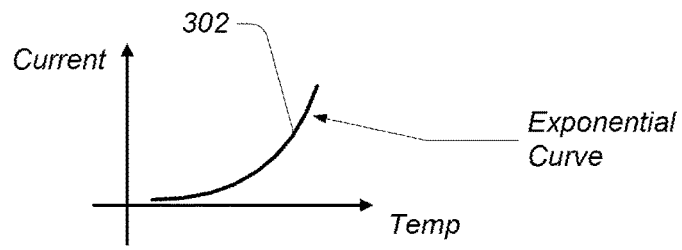
FIG. 3 shows a diagram illustrating the change in current versus change in temperature corresponding to the measurement circuit shown in FIG. 2.

Digital Compensation for the Impact of Input Bias Current on Current Measurements In some embodiments, one or more buffers may be used in the signal path of an SMU where a high impedance node (output node) is located. For example, one or more JFET Op-Amps or JFET buffers may be used in the signal path of the SMU where the high impedance node, or output node is located. For best measurement performance at the high impedance node, when an input bias current is present, it is preferably a low and stable input bias current. Because of the need of other parameters/characteristics that certain types of buffers/Op-Amps (e.g. CMOS buffers/Op-Amps) may not have, Op-Amps and/or buffers having certain well-defined characteristics (with respect to certain environmental parameters such as temperature, or with respect to other type of parameters that may have a direct or indirect effect on the current measurements), e.g. JFET Op-Amps and/or JFET buffers are preferred. Using JFET Op-Amps/buffers as an example, the JFET Op-Amps have certain well-defined characteristics, and the respective input bias currents of JFET buffers/Op-Amps change perceptibly with temperature, as illustrated in FIG. 3. Specifically, a change in temperature may lead to an exponential change in current as illustrated in the graph shown in FIG. 3, and as will be discussed further below. In general, buffers having certain well-defined characteristics may be considered to include buffers/circuit components having certain electrical properties that are clearly defined, e.g. through mathematical relationships, with respect to certain ambient and/or other parameters, such as temperature, for example.

Figure 2:
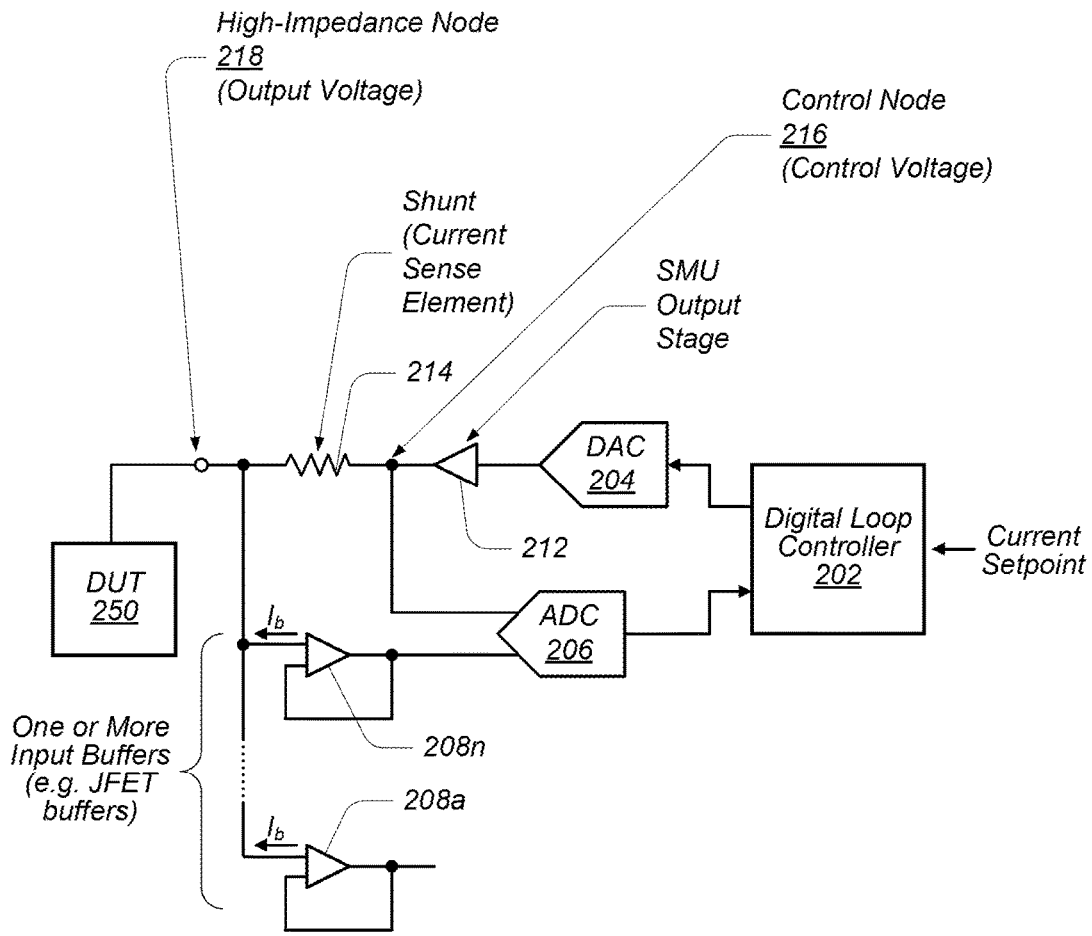
FIG. 2 shows the partial circuit diagram of an exemplary SMU-based measurement circuit using JFET (Junction Field Effect Transistors) input buffers, according to some embodiments.

The circuit topology illustrated in FIG. 2 shows a partial circuit diagram of an SMU-based measurement system, according to some embodiments. As shown in FIG. 2, a digital loop controller 202 may receive a current setpoint value (i.e. a setpoint value that corresponds to a desired current flowing through DUT 250 and therefore also through the current sense element 214) used in generating the control voltage at the control node 216. Responsive at least to providing the control voltage at the control node 216 and thereby causing a current to flow through DUT 250 and shunt element 214, a shunt voltage is developed across the shunt element 214 according at least to the current flowing through the shunt element 214 from providing the control voltage, and an output voltage is developed at the high-impedance node 218. The control signal to generate the control voltage is provided through the DAC 204 and the SMU output stage 212. By measuring the voltage (referred to as the shunt voltage) across the current sense element (or shunt) 214 which has a known impedance value, the value of the current generated in DUT 250 (which is also representative of the current generated in the current sense element 214) may be obtained based at least on the shunt voltage value and the impedance value. A digitized (numeric) shunt voltage value representative of the voltage across the current sense element 214 is provided by the ADC 206 back to the digital loop controller 202. As also indicated in FIG. 2, one or more input devices 208a-208n having well-defined characteristics—e.g. buffers (and/or Op-Amps) implemented using JFET technology—may be coupled in the signal path from the high-impedance node 218 to the ADC 206.

By measuring the temperature and applying a correction algorithm, the impact of the input bias current on the current measurements may be minimized and/or eliminated. In some embodiments, this may be accomplished by adjusting the shunt voltage value provided by the ADC 206 to the digital loop controller 202, according to at least the temperature measurements to account for the change of the input bias currents in the buffers 208a-208n with respect to temperature. It should be noted that adjustments to the shunt voltage value may be made in one of several different ways. In some embodiments, the shunt voltage value may be adjusted without increasing the data width of the output of the ADC 206, for example by performing dithering. In other embodiments, the shunt voltage value may be adjusted in a different way deemed most efficient and/or desirable based on additional system and/or other considerations. In some embodiments, compensating for the impact of the input bias current on the current measurements may include adjusting the control voltage (i.e. the control signal provided to the DAC 204) according to the temperature measurements. In some embodiments, this adjustment may include adjusting the current setpoint value (i.e. the setpoint value of the current) provided to the digital loop controller 202 and used in generating the control voltage.

Figure 4:
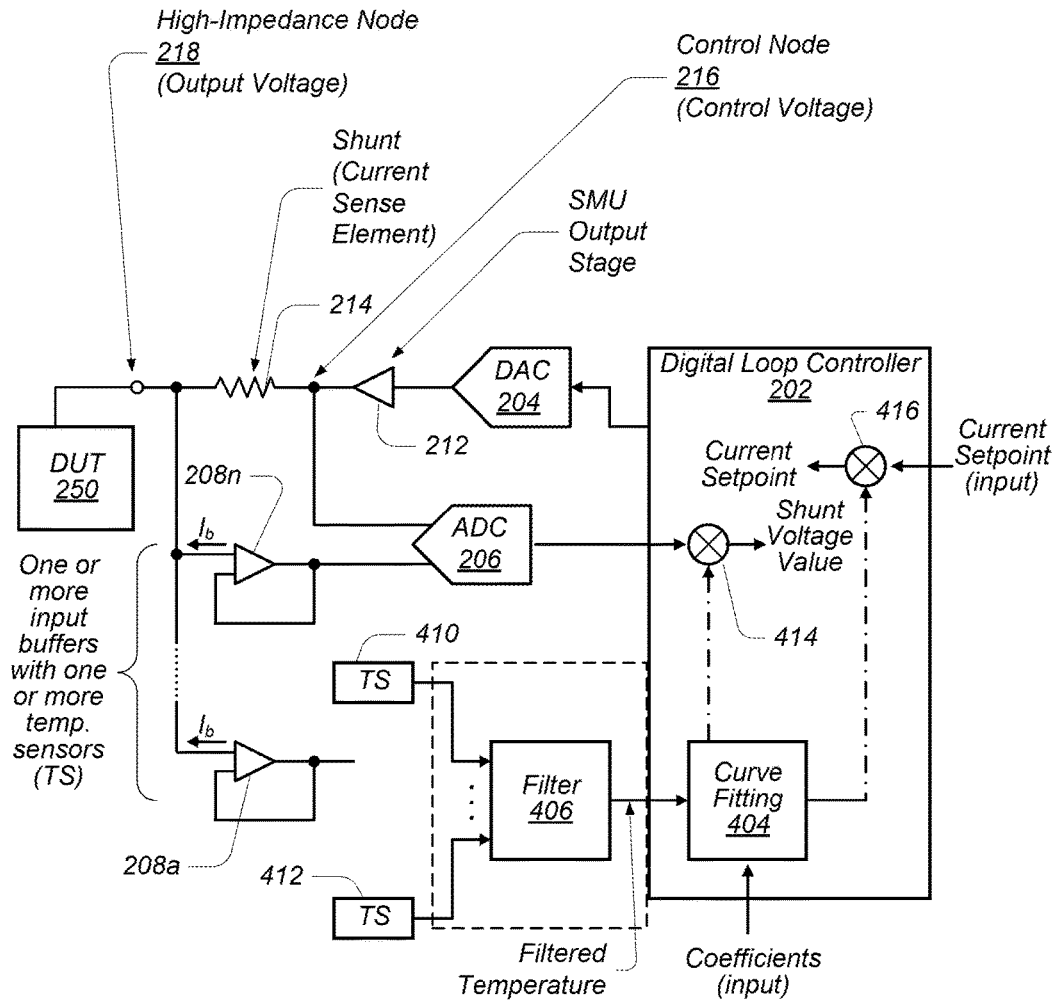
FIG. 4 shows the partial circuit diagram of an exemplary SMU-based measurement circuit that digitally compensates for the impact of input bias current on current measurements, according to some embodiments.

One example of an SMU-based measurement system in which digital compensation is used to mitigate the impact of the input bias current[s] on the current measurements is illustrated in FIG. 4. The input bias current in each buffer 208a-208n is indicated as "$I_b$" in both FIG. 3 and FIG. 4. The temperature may be measured with one or more external temperature sensors indicated in FIG. 4 as temperature sensor circuits/elements "TS" 410/412, coupled to a filter 406. The measurements from such temperature sensors may be adjusted to match the thermal properties of the measurement system, e.g. the thermal properties on the circuit board on which the measurement system resides, and/or they may be filtered—through filter 406—to reduce noise (as shown in FIG. 4). Using an internal sensing element of the buffer(s) 208a-208n, e.g. an internal sensing element of the Op-Amp, to measure the temperature in the die, such as an ESD protection diode of an unused Op-Amp in a dual-package Op-Amp, may also be used to improve performance.

The temperature may then be used to compensate for the change in the bias current of the buffer/Op-Amp(s) 208a-208n. This may be accomplished due to the property of PN/NP junctions by which the reverse leakage current of the PN/NP junction approximately doubles every 10° C. In other words, the adjustment is possible because of a well-defined physical characteristic of the buffer/Op-Amp with respect to an environmental or other measurable parameter, in this case the well-defined relationship between temperature and the value of the leakage current of the PN junction of the buffer/Op-Amps.

Figure 5:
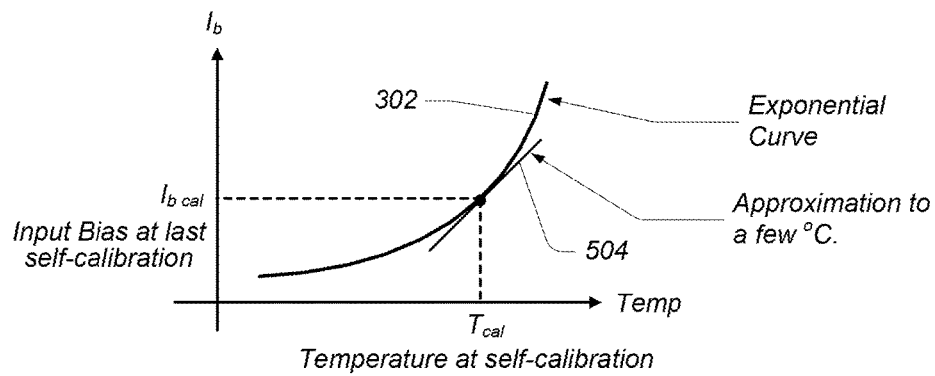
FIG. 5 shows a diagram illustrating the change in current versus change in temperature corresponding to the measurement circuit shown in FIG. 4.

A mathematical representation of the relationship between the current and temperature is illustrated by way of and exponential curve 302 as shown in FIG. 3 and FIG. 5. The general shape of the exponential curve 302 is determined by the physical properties of buffers, e.g. in this case the physical properties of the JFET transistors, and an even more precise curve may be obtained by characterizing a batch of Op-Amps/buffers, or developing a routine for characterization during manufacturing. It should be noted that if the entire curve is characterized, then there may be no need to have knowledge of additional bias current point[s] at a specific reference temperature[s]. Such a bias point may be of use however, when attempting to avoid having to characterize the entire curve.

As shown in FIG. 4, the digital loop controller 202 may be designed to include the capability to make adjustments to the shunt voltage value provided by the ADC 206 at control node 414, and/or to the current setpoint value provided to the digital loop controller 202 at control node 416. It is noted that the shunt voltage value provided by ADC 206 is directly representative of the measured current, specifically the measurement of the current conducted by (or flowing in) DUT 250 and therefore also conducted by (or flowing in) shunt element 214, and therefore any adjustments to the measured shunt voltage value also represent an adjustment to the measured current value. In some embodiments, the filter 406 used for filtering the temperature measurements may be included in the digital loop controller 202. The curve fitting circuit block 404 may be used to determine the level or value of the adjustment to compensate for the impact of the input bias current(s) in buffer(s) 208a-208n, as will be further detailed below.

It should also be noted that for a known exponential relationship between the (environmental) parameter and the well-defined operating characteristic, e.g. between the (ambient) temperature and the bias current (of the buffer), the amount of correction applied to the shunt voltage value according to the temperature is proportional to the actual value of the bias current. Accordingly, in one set of embodiments, a self-calibration phase may be performed prior to the current measurements. During the self-calibration phase, the buffer bias current and temperature may both be measured. Then, during operation, e.g. for the actual current measurements, an estimate of the buffer bias current may be subtracted from the measured current value according to at least the temperature measured during the current measurements. The estimate will be commensurate with the buffer bias current measured during the self-calibration phase if the temperature measured during the current measurements is the same as the temperature measured during the self-calibration phase. If the temperature is no longer the same, a linear (or polynomial) scaling may be applied to the change in temperature, and the obtained scaling factor may be multiplied by the value of the bias current measured during self-calibration, which yields an effective bias current value that can then be used to adjust the measured current value.

The self-calibration phase provides an effective way to determine the extent to which the buffers leak current, which eliminates the need to depend on a particular leakage current vs. temperature relationship (e.g. 10 pA at 25 C, 20 pA at 35 C, etc.), relying instead on a more general/universal leakage current vs. temperature relationship (e.g. leakage doubles every 10 degrees). The latter is much more dependable. For example, the buffers may be switched to a different operational amplifier altogether, and the leakage current vs. temperature relationship remains exponential, even if the absolute level (or value) of the leakage current changes to a completely different value. Obtaining a single point on the curve during self-calibration facilitates estimating the entire curve (see for example FIG. 5), particularly if the temperature during the current measurements remains within a specified number of degrees (e.g. within 5 or 10 degrees) of the temperature measured during self-calibration.

The digital loop controller 202 may be considered a processing element, which may include various elements or combinations of elements that are capable of performing a function in a device, e.g. in a measurement device or specifically in an SMU, among others. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations thereof. Accordingly, the digital loop controller 202 may be a single piece of hardware executing programming instructions, or it may be a combination of circuitry and hardware executing programming instructions, and various embodiments may not include a separate curve fitting logic block, etc. Overall, the control voltage value, shunt voltage value and/or the current setpoint may be adjusted based on the temperature measurements to specifically compensate for the impact of the bias currents on the current measurements. The coefficients input to the curve fitting [logic] block/circuit 404 may be determined/calculated off-line, or they may also be part of the functionality of the digital loop controller 202. The various components within the digital loop controller 202—such as control nodes 414 and 416 and curve fitting circuit 404, for example—are shown for ease of understanding and may be implemented as part of a single overall functionality performed by the digital loop controller 202 or they may be included as separate logic/circuit blocks, or combinations thereof.

The method of correction may be selected/specified as desired, for example based on which parameters are measured and/or controlled using the SMU-based measurement circuit. For example, in case of current control, the control voltage may be adjusted based at least on the temperature measurements. Another case may include controlling the voltage across a DUT (not shown) coupled to the high impedance node 218, and measuring the current (based at least on the shunt voltage value and impedance of the shunt element 214). In that case, the voltage across the shunt element 214 may be determined at least by the current flowing through the DUT and the bias current of the Op-Amps/buffers 208a-208n, and may not be directly affected by the control voltage in any significant way. Accordingly, when controlling the output voltage (i.e. voltage across the DUT), in order to compensate for the bias current of the Op-Amps/buffers, the shunt voltage value may be adjusted based at least on the temperature measurements, as indicated by control node 414 receiving an input from curve fitting circuitry 404 in addition to the value representative of the shunt voltage (voltage across shunt element 214) received from ADC 206. It should also be noted that this adjustment is made to the shunt voltage value, i.e. the digital value representative of the shunt voltage and returned by the ADC 206, and therefore does not represent an adjustment made to the actual shunt voltage. In other words, the shunt voltage value is adjusted/updated in/by the digital loop controller 202 according to the temperature measurements (e.g. from the curve fitting block 404) as illustrated/shown in FIG. 4.

Different buffers/Op-Amps may have significant differences between their respective absolute input bias current [values] at any given temperature. However, the exponential relationship for a particular buffer/Op-Amp design is expected to be very similar across different batches of such similar parts. This may be used to avoid having to characterize the entire input bias current vs. temperature curve for every individual buffer/Op-Amp as long as a reference input bias current [value] and a corresponding reference temperature [value] can be determined or measured. With those reference measurements and characterization of the exponential relationship for a given Op-Amp design, an adjusted curve may be determined/calculated that closely approximates the actual bias current vs. temperature curve of a particular part. Accordingly, in addition to correcting measurements for bias current drift (i.e., digitally compensating for the impact of the input bias current on the current measurement) while the entire curve is known, it is also possible to avoid full characterization on a part-by-part basis by measuring a reference point and applying the corresponding characterized exponential relationship.

In some embodiments, the adjustment (calculation[s]) may be performed in real-time with the use of an FPGA, DSP, application specific [integrated] circuit or other programmable device or combination thereof (e.g. in the digital loop controller 202 as also mentioned above), or it may be performed off-line after the data has been collected (e.g. also in the digital loop controller 202 or in some other circuitry and/or hardware suitable to perform the calculations).

Applying the adjustment calculation in real time increases control accuracy of the output current level (via the control voltage) in addition to increasing the accuracy of the current measurement.

In some embodiments, in order to simplify real-time adjustment, the exponential curve 302 may be fitted with a line 504 (as exemplified in FIG. 5), a quadratic equation or other higher order approximation, for example in the curve fitting circuitry/element 404 shown in FIG. 4. When performing such curve fitting:

- A known characteristic exponential curve may be used
- The value of the input bias current of the buffer/Op-Amp at the operating temperature during the current measurements may be known
- The coefficients characterizing/defining the line or other higher order equation may be calculated in advance
- The temperature may be allowed to deviate from the operating temperature within a specified range of values, inclusive of the operating temperature.

When the temperature is outside the specified range, the [value of the] input bias current corresponding to the new operating temperature may be determined, for example by executing a function/subroutine, and the corresponding coefficients may be calculated/determined. The ability to identify/determine the [value of the] input bias current and adjusting the curve facilitates not only the use of a line or other higher order equation to approximate the exponential curve, but also the use of an exponential curve that does not have to be perfectly aligned to the behavior of the buffer/Op-Amp.

Figure 6:
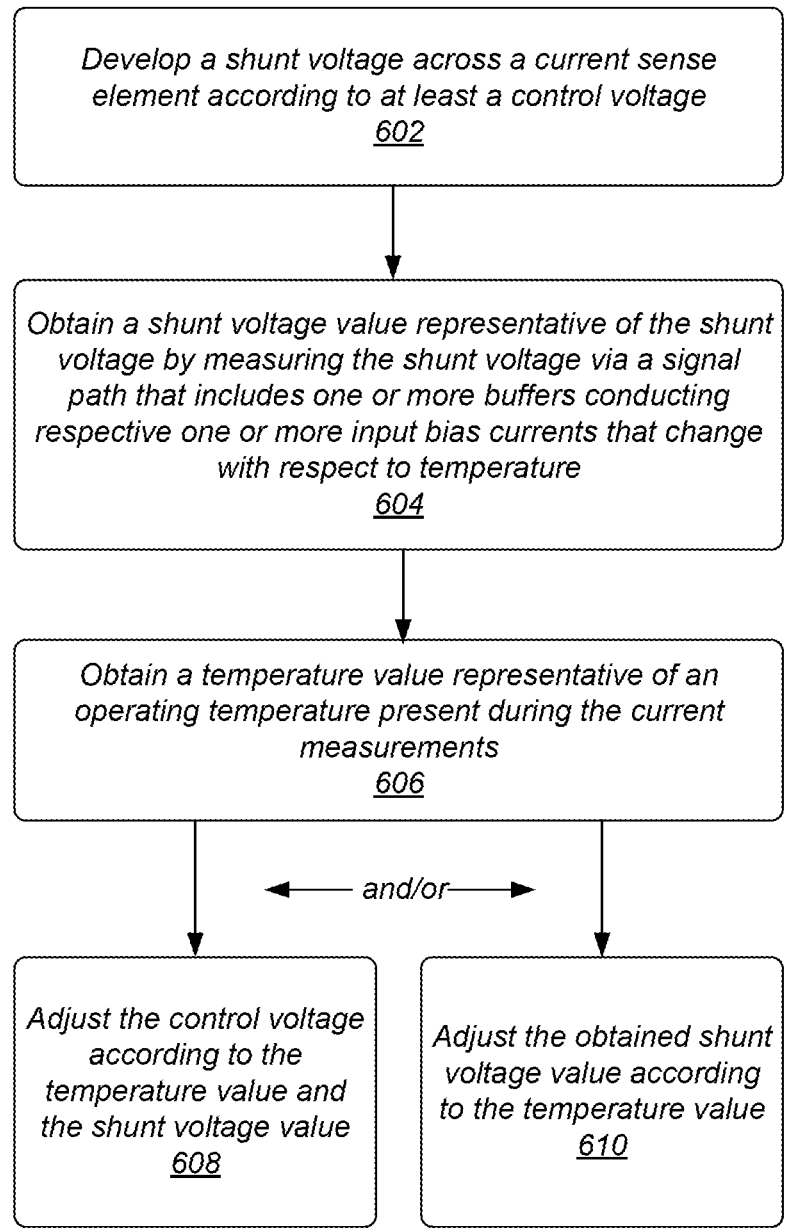
FIG. 6 shows a flow diagram of an exemplary method for digitally compensating the impact of input bias current on current measurements, according to some embodiments.

FIG. 6 shows a flow diagram of an exemplary method for digitally compensating for the impact of input bias current on current measurements, according to some embodiments. When intending to make current measurements, a shunt voltage may first be developed across a current sense element according to a control voltage (602). The method further includes obtaining a shunt voltage value representative of the shunt voltage by measuring the shunt voltage via a signal path that includes one or more buffers conducting respective one or more input bias currents that change with respect to temperature (604). The buffers may be Op-amps, or more specifically, JFET Op-amps. More generally, the buffers may have certain well-defined characteristics, e.g. with respect to some environmental parameters such as temperature, or with respect to other type(s) of parameters that may have a direct or indirect effect on measurements.

Accordingly, a temperature value representative of an operating temperature present during the current measurements may also be obtained (606). Again, more generally, a value or values representative of certain parameter(s) may be obtained, where the parameters correspond to environmental conditions and/or other conditions that may affect the measurement(s) and with respect to which the buffers have a well-defined characteristic. For example, a JFET Op-amp may have a well-defined relationship between its input bias current and temperature, e.g. the JFET Op Amps may develop respective input bias currents that change perceptibly and predictably with temperature.

The measurement may then be adjusted by adjusting the control voltage according to the obtained temperature (or parameter) value and the shunt voltage value (608), and/or the shunt voltage value may be adjusted according to the obtained temperature (or parameter) value (610). Additional operations may also be performed, such as digitally controlling the control voltage according to a current setpoint, filtering the measurements of the operating temperature, and/or adjusting the temperature value to match the thermal properties the circuit board on which the one or more buffers may be configured. Furthermore, in some embodiments, when controlling the control voltage according to a current setpoint, the control voltage may be adjusted by adjusting the current setpoint according to the temperature value. In some embodiments, measurements of the operating temperature may be obtained during the current measurements themselves.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A method for digitally compensating for an impact of one or more parameters on current measurements, the method comprising:
    developing a shunt voltage across a current sense element according to a control voltage;
    obtaining a shunt voltage value representative of the shunt voltage, comprising measuring the shunt voltage at least via a signal path that includes one or more components having a well-defined operational characteristic with respect to at least one parameter of the one or more parameters;
    obtaining a parameter value representative of an actual state of the at least one parameter at the one or more components during the measuring of the shunt voltage; and
    adjusting for a change of state of the one or more components that occurs, during the measuring of the shunt voltage, according to the well-defined operational characteristic, comprising adjusting one or more of the following:
        the control voltage at least according to the obtained parameter value and the shunt voltage value; or
        the shunt voltage value at least according to the obtained parameter value.

2. The method of claim 1, further comprising digitally controlling the control voltage at least according to a current setpoint.

3. The method of claim 2, wherein said adjusting the control voltage at least according to the obtained parameter value and the shunt voltage value comprises adjusting the current setpoint at least according to the obtained parameter value.

4. The method of claim 1, wherein said obtaining the parameter value comprises obtaining measurements of the actual state of the at least one parameter during the current measurements.

5. The method of claim 4, further comprising filtering the measurements to reduce noise.

6. The method of claim 1, further comprising adjusting the obtained parameter value to match associated properties of at least a circuit board on which the one or more buffers are configured.

7. The method of claim 1, wherein the one or more parameters comprise environmental variables.

8. The method of claim 1, wherein adjusting the shunt voltage value comprises:

adjusting the shunt voltage value according to a polynomial approximation of a relationship of the well-defined operational characteristic with respect to the at least one parameter.

9. A measurement system for measuring current, the measurement system comprising:
a current sense element;
one or more buffers coupled to the current sense element, forming a signal path that includes the current sense element and the one or more buffers, wherein the one or more buffers are conducting respective one or more input bias currents that change with respect to temperature when the signal path is conducting a current; and
a control circuit coupled to the current sense element and the one or more buffers, wherein the control circuit is configured to:
cause the signal path to conduct the current at least in response to a control voltage, wherein a shunt voltage is developed across the current sense element at least according to the current;
obtain a shunt voltage value representative of the shunt voltage;
obtain a temperature value representative of an operating temperature; and
adjust one or more of the following:
the control voltage at least according to the temperature value and the shunt voltage value; or
the shunt voltage value at least according to the temperature value.

10. The measurement system of claim 9, wherein the control circuit is further configured to digitally adjust the control voltage at least according to a current setpoint.

11. The measurement system of claim 10, wherein to adjust the control voltage the control circuit is configured to adjust the current setpoint at least according to the temperature value.

12. The measurement system of claim 9, wherein the control circuit is further configured to obtain measurements of the operating temperature during current measurements, and obtain the temperature value based at least on the measurements of the operating temperature.

13. The measurement system of claim 12, further comprising a filter circuit configured to filter the measurements of the operating temperature, wherein the control circuit is further configured to obtain the temperature value based at least on the filtered measurements of the operating temperature.

14. The measurement system of claim 9, wherein the control circuit is further configured to adjust the temperature value to match thermal properties of at least a circuit board on which the one or more buffers are configured.

15. An apparatus for performing current measurements, the apparatus comprising:
a processing element configured to:
develop a shunt voltage across a sense element according to at least a control voltage;
obtain a shunt voltage value representative of the shunt voltage by measuring the shunt voltage via a signal path that includes one or more buffers conducting respective one or more input bias currents that change with respect to temperature;
obtain a temperature value representative of an operating temperature during the current measurements; and
adjust one or more of the following:
the control voltage at least according to the temperature value and the shunt voltage value; or
the shunt voltage value at least according to the temperature value.

16. The apparatus of claim 15, wherein the processing element is further configured to digitally adjust the control voltage at least according to a current setpoint.

17. The apparatus of claim 16, wherein the processing element is further configured to adjust the control voltage by adjusting the current setpoint at least according to the temperature value.

18. The apparatus of claim 15, wherein the processing element is further configured to obtain the temperature value based at least on measurements of the operating temperature obtained during the current measurements.

19. The apparatus of claim 18, further comprising a filter configured to filter the measurements of the operating temperature, wherein the processing element is further configured to obtain the temperature value based at least on the filtered measurements of the operating temperature.

20. The apparatus of claim 15, wherein the processing element is further configured to adjust the temperature value to match thermal properties of at least a circuit board on which the one or more buffers are configured.

* * * * *